US012750015B1

United States Patent
(12)

Imani et al.

(10) Patent No.: US 12,750,015 B1

(45) Date of Patent: Sep. 29, 2026

(54) ANALOG FRONT END OF RECEIVER FOR HIGH BAUD-RATE COMMUNICATIONS

(71) Applicant: Marvell Asia Pte Ltd, Singapore (SG)

(72) Inventors: Alireza Imani, Carlsbad, CA (US); Ray Luan Nguyen, Fountain Valley, CA (US); Geoffrey Hatcher, Lake Forest, CA (US); Tzu-Fan Wu, Irvine, CA (US)

(73) Assignee: Marvell Asia Pte Ltd, Singapore (SG)

( * ) Notice: Subject to any disclaimer, the term of this patent is extended or adjusted under 35 U.S.C. 154(b) by 576 days.

(21) Appl. No.: 18/119,796

(22) Filed: Mar. 9, 2023

Related U.S. Application Data

(60) Provisional application No. 63/317,995, filed on Mar. 9, 2022.

(51) Int. Cl.

| | |
|---|---|
| ***H03F 1/56*** | (2006.01) |
| ***H03F 3/193*** | (2006.01) |
| ***H03F 3/45*** | (2006.01) |
| ***H03H 7/38*** | (2006.01) |

(52) U.S. Cl.

CPC ............... *H03F 1/56* (2013.01); *H03F 3/193* (2013.01); *H03F 3/45179* (2013.01); *H03H 7/38* (2013.01); *H03F 2200/135* (2013.01); *H03F 2200/21* (2013.01); *H03F 2200/222* (2013.01); *H03F 2200/451* (2013.01); *H03F 2203/45018* (2013.01); *H03F 2203/45024* (2013.01)

(58) Field of Classification Search

CPC ...... H03F 1/56; H03F 3/193; H03F 2200/451; H03F 2200/222; H03F 3/45179; H03F 2200/135; H03F 2200/21; H03F 2203/45018; H03F 2203/45024; H03H 7/38

USPC .......................................................... 330/291

See application file for complete search history.

(56) References Cited

U.S. PATENT DOCUMENTS

| | | | | |
|---|---|---|---|---|
| 10,038,506 | B2 | 7/2018 | Crivelli et al. | |
| 10,218,444 | B2 | 2/2019 | Gopalakrishnan et al. | |
| 10,742,227 | B1 * | 8/2020 | Schifmann | H03M 1/1215 |
| 10,998,307 | B1 * | 5/2021 | Zheng | H03M 1/66 |
| 11,088,719 | B1 * | 8/2021 | Liu | H02H 9/045 |
| 2010/0231305 | A1 * | 9/2010 | Mizokami | H03F 3/45179 330/277 |
| 2011/0025418 | A1 * | 2/2011 | Aram | H03F 3/45179 330/253 |

(Continued)

FOREIGN PATENT DOCUMENTS

| | | | | |
|---|---|---|---|---|
| CN | 102916666 A | * | 2/2013 | |
| CN | 112803899 A | * | 5/2021 | H03F 1/26 |
| WO | 2023003944 A1 | | 1/2023 | |

*Primary Examiner* — Andrea Lindgren Baltzell

*Assistant Examiner* — Lance Torbjorn Bartol

(57) ABSTRACT

In an analog front end (AFE) for a communication receiver, an input matching network is configured to receive a differential input signal. One or more first buffer amplifiers are coupled to the input matching network. A sampler array is coupled to the one or more first buffer amplifiers. The sampler array includes a plurality of instances of track and hold circuitry, each instance of the track and hold circuitry configured to generate an analog output signal. A plurality of second buffer amplifiers are coupled to the sampler array. Each second buffer amplifier comprises respective super source follower (SSF) circuitry and is configured to amplify a respective analog output signal of the sampler array.

18 Claims, 5 Drawing Sheets

(56) References Cited

U.S. PATENT DOCUMENTS

| | | | | |
|---|---|---|---|---|
| 2018/0262374 | A1* | 9/2018 | Cheng | H03F 3/45201 |
| 2019/0235050 | A1* | 8/2019 | Maligeorgos | G01S 7/032 |
| 2022/0224302 | A1 | 7/2022 | Dallaire et al. | |

* cited by examiner

ANALOG FRONT END OF RECEIVER FOR HIGH BAUD-RATE COMMUNICATIONS

CROSS REFERENCES TO RELATED APPLICATIONS

This application claims the benefit of U.S. Provisional Patent Application No. 63/317,995, entitled "Bandwidth Extension Techniques for Analog Front End in 200GS/S or Higher Communication Systems," filed on Mar. 9, 2022, the disclosure of which is hereby expressly incorporated herein by reference in its entirety.

FIELD OF TECHNOLOGY

The present disclosure relates generally to communication systems, and more particularly to analog front ends in high bandwidth communication devices.

BACKGROUND

During this time of growth of Internet technologies and usage, demand for high speed data transmission has increased rapidly. As an example, average internet traffic in 2021 was estimated to exceed 700 terabytes per second. Technologies to support such sustained usage levels will continue to proliferate. Optical transmission of data can support vast amounts of data per channel-often limited more by the rate at which electronics can encode a signal onto the optical channel rather than the bandwidth of the channel itself.

High baud-rate receivers, such as used in optical communication systems, typically include high sampling rate analog-to-digital converters (ADCs) and high-performance digital signal processing (DSP) devices to recover an information signal in the presence of optical and electrical impairments. Such receivers typically include high bandwidth, high linearity analog-front-End (AFE) circuitry that conditions an analog signal for sampling by an ADC to generate a corresponding digital signal. The digital signal is then provided to a high-performance DSP for processing.

As advances are made in semiconductor fabrication technology, component geometries of increasingly smaller geometries, higher levels of integration and lower power dissipation can be achieved, thus enabling next generation, higher baud-rate applications. However, implementing high bandwidth, high performance AFEs with these smaller semiconductor geometries is challenging.

SUMMARY

In an embodiment, analog front end (AFE) circuitry for a communication receiver comprises: an input matching network configured to receive a differential input signal; one or more first buffer amplifiers coupled to the input matching network; a sampler array coupled to the one or more first buffer amplifiers, the sampler array comprising a plurality of instances of track and hold circuitry, each instance of the track and hold circuitry configured to generate an analog output signal; and a plurality of second buffer amplifiers coupled to the sampler array. Each second buffer amplifier comprises respective super source follower (SSF) circuitry and is configured to amplify a respective analog output signal of the sampler array.

In another embodiment, AFE circuitry for a communication receiver comprises: an input matching network configured to receive a differential input signal; a plurality of first buffer amplifiers coupled to the input matching network. Each first buffer amplifier comprises a class AB buffer amplifier that includes: a first NMOS transistor having a source and a drain; a first PMOS transistor having a source coupled to the source of the first NMOS transistor; a second NMOS transistor having a source and a drain; a first PMOS transistor having a source coupled to the source of the first NMOS transistor; first feedback circuitry coupled between the source of the first NMOS transistor and the drain of the second NMOS transistor, and coupled between the source of the second NMOS transistor and the drain of the first NMOS transistor; and second feedback circuitry coupled between the source of the first PMOS transistor and a drain of the second PMOS transistor, and coupled between the source of the second PMOS transistor and a drain of the first PMOS transistor. The AFE circuitry further comprises: a sampler array coupled to the one or more first buffer amplifiers, the sampler array comprising a plurality of instances of track and hold circuitry, each instance of the track and hold circuitry configured to generate an analog output signal; and a plurality of second buffer amplifiers coupled to the sampler array, each second buffer amplifier being configured to amplify a respective analog output signal of the sampler array.

In yet another embodiment, AFE circuitry for a communication receiver comprises an input matching network configured to receive a differential input signal. The input matching network includes: a first T-coil circuit; a second T-coil circuit; a first impedance coupled between the first T-coil circuit and a first input node of the input matching network; and a second impedance coupled between the second T-coil circuit and a second input node of the input matching network, the first impedance and the second impedance being configured to shift a portion of input loss of the impedance matching network to a frequency above a signaling frequency corresponding to the AFE. The AFE further comprises: one or more first buffer amplifiers coupled to the input matching network; a sampler array coupled to the one or more first buffer amplifiers, the sampler array comprising a plurality of instances of track and hold circuitry, each instance of the track and hold circuitry configured to generate an analog output signal; and a plurality of second buffer amplifiers coupled to the sampler array, each second buffer amplifier comprising respective super source follower (SSF) circuitry and being configured to amplify a respective analog output signal of the sampler array.

DETAILED DESCRIPTION

High baud-rate receivers, like optical coherent receivers for 400 gigabits per second (400G) or higher rate applications, require high-performance digital signal processors (DSPs) to recover the signal in the presence of optical and electrical impairments. Typically, many DSPs operate in parallel in order to process the high baud-rate signals. Such DSPs are usually implemented using complementary metal-oxide-semiconductor (CMOS) fabrication technology to allow integration of many of DSPs on a single integrated circuit (IC) chip to minimize power dissipation, which is typically critical to meet power requirements of typical optical module form factors. In addition to the DSPs, such a receiver IC also typically includes high bandwidth, high linearity analog front end (AFE) circuitry, followed by a high sampling rate analog-to-digital converters (ADC).

Implementing high bandwidth, high performance AFEs on CMOS with smaller semiconductor geometries is challenging. For instance, factors such as parasitic capacitance, resistance overhead, 1/f noise, voltage headroom, etc., have become increasingly problematic as semiconductor geometries become smaller.

In embodiments described below, example AFE circuitry operates in the context of an optical communication receiver. In other embodiments, similar AFE circuitry operates in the context of other suitable types of communication devices, such as wireless receivers, receivers that communicate via metallic (e.g., copper) cables, etc.

Figure 1:
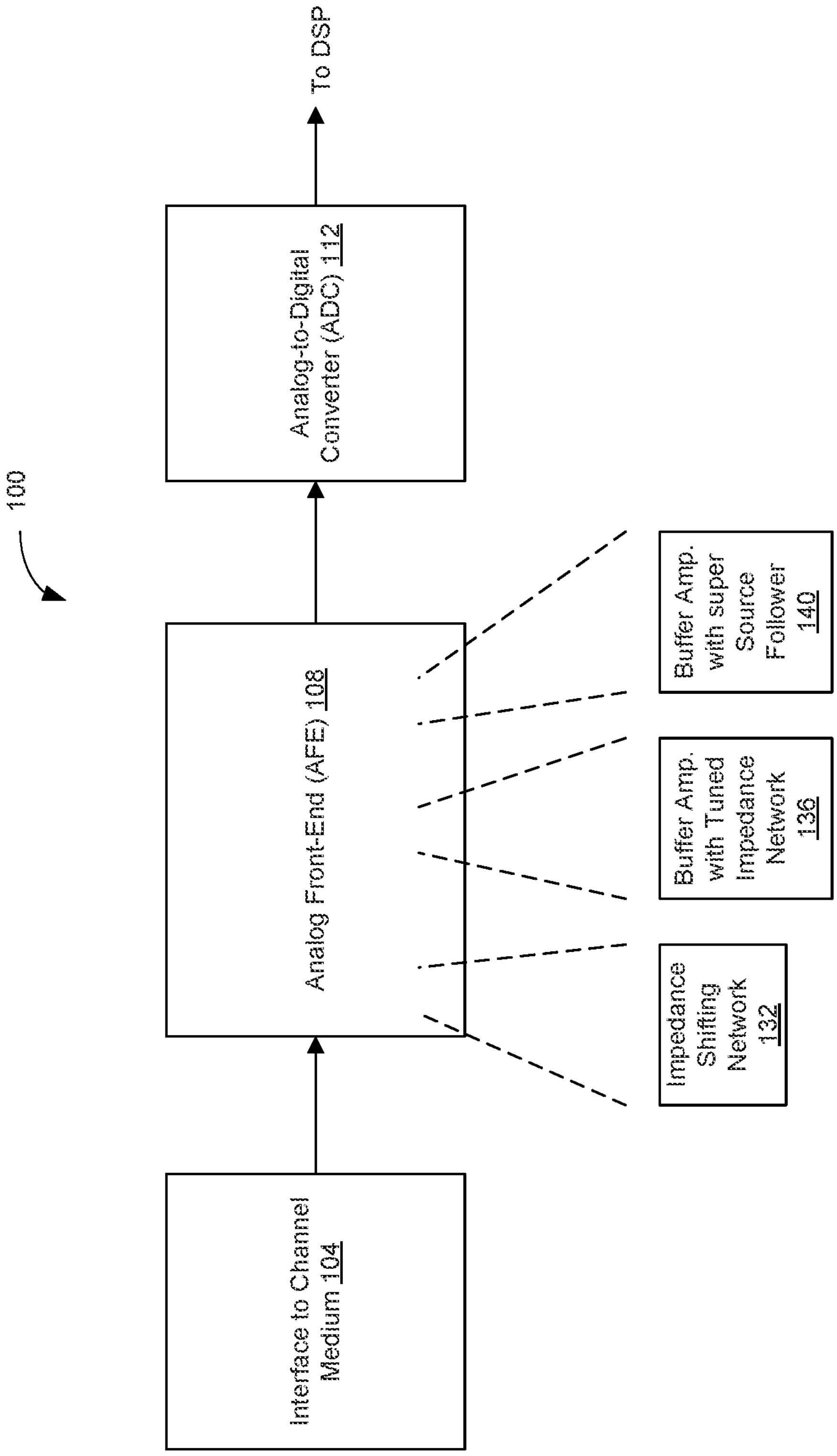
FIG. 1 is a simplified block diagram of a portion of an example high baud rate receiver, according to an embodiment.

FIG. 1 is a simplified block diagram of a portion of an example receiver 100, according to an embodiment. The portion of the receiver 100 (sometimes referred to herein as "the receiver 100" for purpose of brevity) illustrated in FIG. 1 generally corresponds to converting an analog optical signal, received via a communication medium, to a digital signal. The receiver 100 corresponds to a 400G optical receiver, in an embodiment. In other embodiments, the receiver 100 is for suitable applications other than 400G.

The receiver 100 comprises an interface 104 to the channel medium, analog front end circuitry (AFE) 108, and an analog-to-digital converter (ADC) 112. A digital signal generated by the ADC 112 is provided to a DSP for processing, such as digital filtering, decoding, etc.

The interface 104 comprises various suitable components such as one of or any suitable combination of two or more of: an optical demultiplexer, one or more diodes for converting optical signal(s) to electrical signal(s), etc. The AFE 108 is configured to condition an electrical signal received from the interface 104 for conversion by the ADC 112 into a digital domain. In an embodiment, the ADC 112 comprises an array of sub-ADCs (not shown) configured to operate in a time-interleaved manner to sample at respective phase shifts, and the AFE 108 is configured to generate a plurality of conditioned electrical signals that are provided to the array of sub-ADCs.

The AFE 108 comprises impedance matching circuitry that includes impedance shifting network circuitry 132, in an embodiment. The impedance shifting network circuitry 132 is configured to match an impedance corresponding to the interface 104 to improve power transfer from the interface 104 to the AFE 108 and to reduce return loss. Return loss of impedance matching circuitry generally increases with frequency. However, as is explained further below, the impedance shifting network circuitry 132 is configured to shift a significant portion of return loss to frequencies above a signaling frequency of the signal from the communication medium. Thus, the impedance shifting network circuitry 132 provides improved high bandwidth performance with reduced return loss.

In some embodiments, the AFE 108 includes other suitable impedance matching circuitry that does not include the impedance shifting network circuitry 132.

The AFE 108 also comprises a first buffer amplifier (buffer 1) 136 that includes a tuned impedance network, in an embodiment. The first buffer amplifier 136 generally processes an electrical signal output by the impedance shifting network circuitry 132. The first buffer amplifier 136 is configured to generate an output with a high output impedance for track and hold circuitry (not shown) of the AFE 108. As will be explained further below, a tuned impedance network of the first buffer amplifier 136 provides an inductive output impedance at the signaling frequency, which improves performance at the signaling frequency.

In some embodiments, the AFE 108 includes another suitable buffer amplifier, different than the first buffer amplifier 136, that does not include the tuned impedance network discussed above.

The AFE 108 also comprises a second buffer amplifier (buffer 2) 140 that includes super source follower (SSF) circuitry. The second buffer amplifier 140 is configured to amplify an output of the track and hold circuitry (not shown) for sampling by the ADC 112. The SSF circuitry of the second buffer amplifier 140 is configured to decrease settling time of the second buffer amplifier 140 and thus improve performance at high signaling frequencies.

In some embodiments, the AFE 108 includes another suitable buffer amplifier different than the second buffer amplifier 140, such as a buffer amplifier that does not include the SSF circuitry discussed above.

Figure 2:
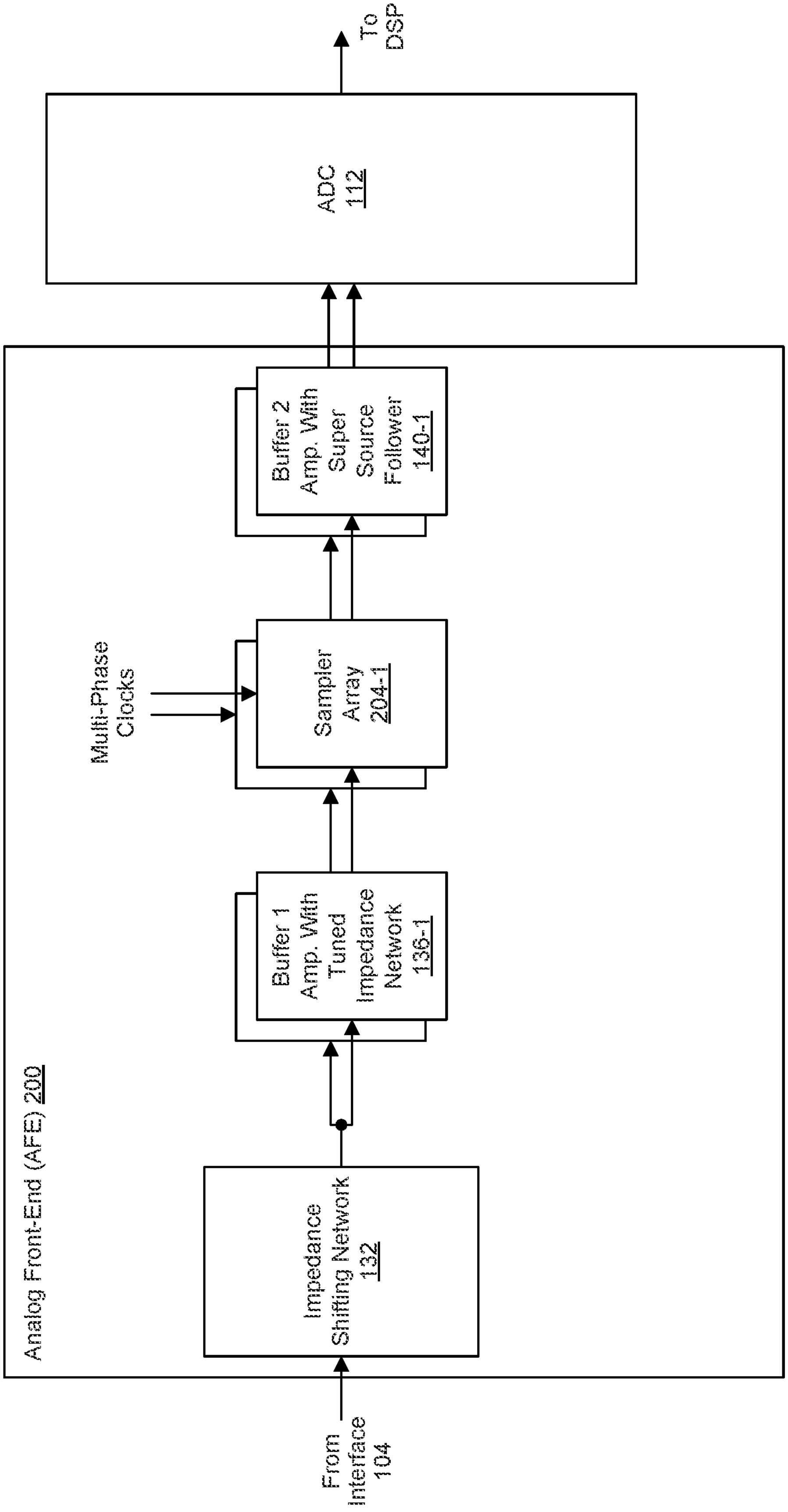
FIG. 2 is a simplified block diagram of an example analog front end (AFE) suitable for use in the example receiver of FIG. 1, according to an embodiment.

FIG. 2 is a simplified block diagram of an AFE 200, according to an embodiment. The AFE 200 of FIG. 2 is used as the AFE 108 of FIG. 1, in an embodiment. In other embodiments, the AFE 200 is used in another suitable receiver different than the receiver 100 of FIG. 1. The AFE 200 is used in a 400G optical receiver, in an embodiment. In other embodiments, the AFE 200 is for suitable applications other than 400G.

The AFE 200 includes the impedance shifting network 132 of FIG. 1, in an embodiment. Additionally, the AFE 200 includes multiple instances of the first buffer amplifier 136 of FIG. 1, and the output of the impedance shifting network 132 is provided to each of the first buffer amplifiers 136, in an embodiment. Although FIG. 2 illustrates two instances of the first buffer amplifier 136, the AFE 200 includes other suitable numbers of instances of the first buffer amplifier 136 in other embodiments.

The outputs of the first buffer amplifiers 136 are processed by multiple instances of sampler array circuitry 204. Each instance of the sampler array circuitry 204 includes multiple instances of track and hold circuitry, each of which is configured to generate an analog output signal that samples a voltage of a continuously varying input analog signal and holds the sampled voltage at a constant level for a particular minimum period of time (sometimes referred to herein as a "track and hold" function). The sampler array circuitry 204 receives a plurality of multi-phase clocks, and each instance of the track and hold circuitry performs a respective track and hold function based on a respective clock among the plurality of multi-phase clocks. Thus, track and hold circuitry of the sampler array circuitry 204 operate in a time-interleaved manner to generate a plurality of outputs, each of which corresponds to an analog-sampled voltage of the continuously varying input analog signal sampled at a respective phase.

Outputs of the sampler array circuitry 204 are processed by multiple instances of the second buffer amplifiers 140.

Each second buffer amplifier 140 is configured to amplify an output of respective track and hold circuitry (not shown) for sampling by the ADC 112.

In some embodiments, the AFE 200 includes other suitable impedance matching circuitry different than the impedance shifting network 132. Similarly, the AFE 200 includes another suitable buffer amplifier, different than the first buffer amplifier 136, that does not include the tuned impedance network discussed above. Additionally, the AFE 200 includes another suitable buffer amplifier, different than the second buffer amplifier 140, that does not include the SSF circuitry discussed above.

In other embodiments, the AFE 200 includes other circuitry such as one or more of i) signal processing, buffering circuitry, etc., between the impedance shifting network 132 and the first buffer circuitry 136, ii) signal processing, buffering circuitry, etc., between the first buffer circuitry 136 and the sampler array circuitry 204, and iii) signal processing, buffering circuitry, etc., between the sampler array circuitry 204 and the second buffer circuitry 140.

Figure 3:
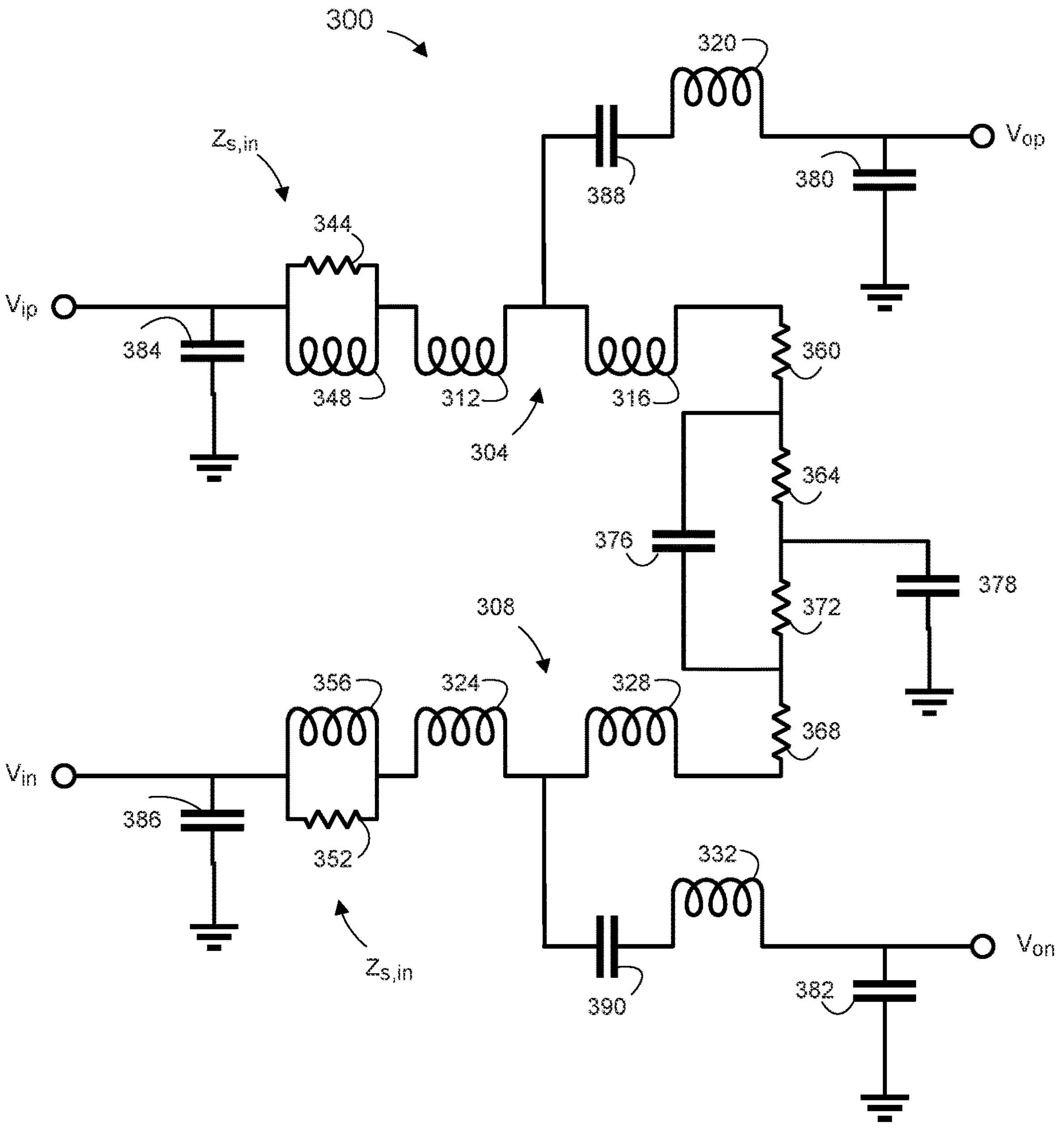
FIG. 3 is a simplified circuit diagram of an example impedance shifting network of the AFE of FIG. 2, according to an embodiment.

FIG. 3 is a simplified circuit diagram of an example impedance shifting network 300, according to an embodiment. The impedance shifting network 300 is used as the impedance shifting network 132 of FIGS. 1 and 2, in some embodiments. In other embodiments, the AFE 108 and/or the AFE 200 include another suitable impedance matching network different than the impedance shifting network 300.

The impedance shifting network 300 includes input nodes, Vip and Vin, for receiving a differential signal, e.g., from the interface 104. Each of Vip and Vin are coupled to a respective T-coil circuit 304, 308. The T-coil circuit 304 comprises an inductor 312 having a first node coupled to Vip and a second node coupled to a first node of an inductor 316. A second node of the inductor 316 is coupled to ground. The second node of the inductor 312 and the first node of the inductor 316 are coupled to a first node of an inductor 320. A second node of the inductor 320 is coupled to an output node Vop. The T-coil circuit 308 comprises an inductor 324 having a first node coupled to Vin and a second node coupled to a first node of an inductor 328. A second node of the inductor 328 is coupled to ground. The second node of the inductor 324 and the first node of the inductor 328 are coupled to a first node of an inductor 332. A second node of the inductor 332 is coupled to an output node Von.

The first node of the inductor 312 is coupled to Vip via an impedance $Z_{s,in}$. In an embodiment, $Z_{s,in}$ includes a resistor 344 coupled in parallel with an inductor 348. Similarly, the first node of the inductor 324 is coupled to $V_{in}$ via an impedance $Z_{s,in}$. In an embodiment, $Z_{s,in}$ includes a resistor 352 coupled in parallel with an inductor 356.

The second node of the inductor 316 is coupled to ground via series resistors 360, 364. In particular, a first node of the resistor 360 is coupled to the second node of the inductor 316; a second node of the resistor 360 is coupled to a first node of the resistor 364; and a second node of the resistor 364 is coupled to ground. Similarly, the second node of the inductor 328 is coupled to ground via series resistors 368, 372. In particular, a first node of the resistor 368 is coupled to the second node of the inductor 328; a second node of the resistor 368 is coupled to a first node of the resistor 372; and a second node of the resistor 372 is coupled to ground. A capacitor 376 is coupled between the second node of the resistor 360 and the second node of the resistor 368.

In operation, the impedance $Z_{s,in}$ at the input nodes Vip and Vin, and shunting of the resistors 364 and 372 by the capacitor 376 increases impedance at the signaling frequency, which improves return loss. Although return loss of the circuitry 300 generally increases with frequency, the impedance $Z_{s,in}$ at the input nodes Vip and Vin, and shunting of the resistors 364 and 372 by the capacitor 376 shifts a significant portion of return loss to frequencies above a signaling frequency, in an embodiment. The values of the inductors 348, 356, the resistors 344, 352, 360, 364, 368, 372, and the capacitor 376 are chosen based on specific application requirements for the impedance shifting network 300 (such as the signaling frequency), and typically based on a tradeoff between increasing bandwidth and reducing return loss.

In some embodiments, the impedance shifting network 300 includes a capacitor 378, which couples the second node of the resistors 364 and 372 to ground.

In some embodiments, the impedance shifting network 300 includes other components, such as capacitors 380 and 382 coupled to output nodes Vop and Von, respectively, for electrostatic discharge; and capacitors 384 and 386 coupled to input nodes Vip and Vin, respectively, for electrostatic discharge. The second node of the inductor 312 is coupled to the first node of the inductor 320 via an alternating current (AC) coupling capacitor 388; and the second node of the inductor 324 is coupled to the first node of the inductor 332 via an AC coupling capacitor 390, according to an embodiment.

Figure 4:
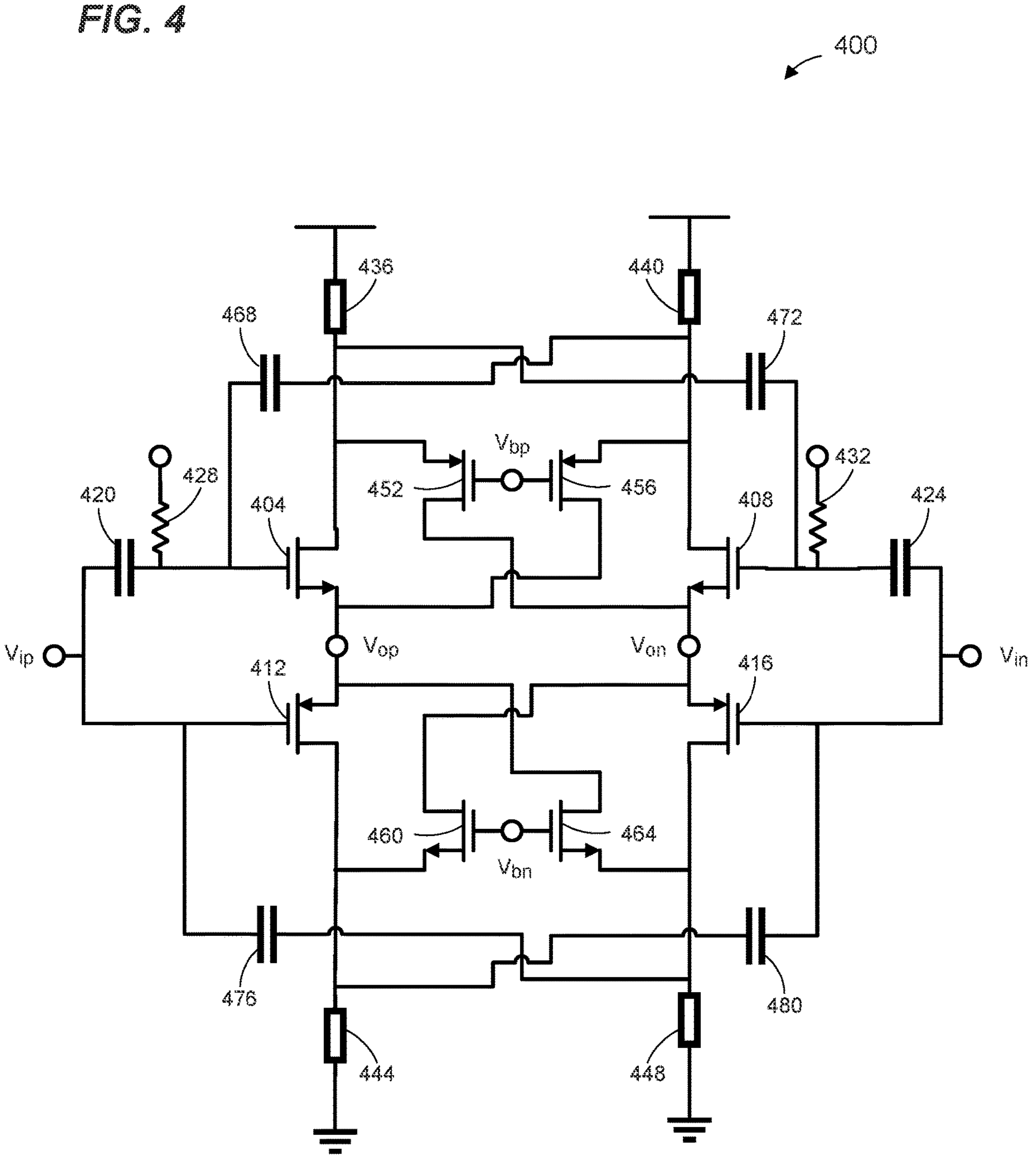
FIG. 4 is a simplified circuit diagram of an example buffer amplifier of the AFE of FIG. 2, according to an embodiment.

FIG. 4 is a simplified circuit diagram of an example buffer amplifier 400, according to an embodiment. The buffer amplifier 400 is used as the first buffer amplifier 136 of FIGS. 1 and 2, in some embodiments. In other embodiments, the buffer amplifier 136 includes another buffer amplifier different than the buffer amplifier 400. For instance, with applications in which maximizing AFE bandwidth is of importance (e.g., for receivers implementing coherent communications) and where the input signal level is usually sufficiently large not to require any amplification, a source follower circuit can be used due to its low output impedance, which is beneficial to drive a large capacitive load while maintaining high bandwidth.

The buffer amplifier 400 includes a class-AB source follower circuit comprising a NMOS transistors 404, 408 and PMOS transistors 412, 416. A source of the NMOS transistor 404 is coupled to a source of the PMOS transistor 412. A source of the NMOS transistor 408 is coupled to a source of the PMOS transistor 416. A gate of the NMOS transistor 404 is coupled to a gate of the PMOS transistor 412 via a capacitor 420. A gate of the NMOS transistor 408 is coupled to a gate of the PMOS transistor 416 via a capacitor 424. In an embodiment, the capacitors 420 and 424 are configured as AC coupling capacitors.

The gate of the NMOS transistor 404 is coupled to a biasing circuit (not shown) via a resistor 428, and the gate of the NMOS transistor 408 is coupled to the biasing circuit (not shown) via a resistor 432. In an embodiment, the resistors 428 and 432 are configured as DC bias resistors.

The gate of the PMOS transistor 412 is coupled to an input node, Vip, and the gate of the PMOS transistor 416 is coupled to an input node, Vin, where the input nodes Vip and Vin correspond to a differential input. The source of the NMOS transistor 408 and the source of the PMOS transistor 412 correspond to an output node Vop, and the source of the NMOS transistor 408 and the source of the PMOS transistor correspond to an output node Von, where the output nodes Vop and Von correspond to a differential output.

The input nodes Vip and Vin are coupled to a differential output of impedance matching circuitry, such as the differential output of the impedance shifting network 132 of FIGS. 1 and 2, the differential output Vop and Von of the impedance shifting network 300 of FIG. 3, or a differential output of other suitable impedance matching circuitry, in various embodiments. The output nodes Vop and Von are coupled to differential input(s) of one or more sets of sampler array circuitry 204, or other suitable circuitry, in various embodiments.

The PMOS transistors 412 and 416 are DC coupled to the differential input whereas the NMOS transistors 404 and 408 are AC coupled to the differential input via the capacitors 420 and 424, respectively. In other embodiments, the PMOS transistors 412 and 416 are also AC coupled to the differential input via respective AC coupling capacitors like the capacitors 420 and 424.

The buffer amplifier 400 includes feedback circuitry with tuned impedance. The feedback circuitry is coupled to a drain of the NMOS transistor 404, a drain of the NMOS transistor 408, a drain of the PMOS transistor 412, and a drain of the PMOS transistor 416. For example, the drain of the NMOS transistor 404 is coupled to a power supply via an impedance 436, and the drain of the NMOS transistor 408 is coupled to the power supply via an impedance 440. Similarly, the drain of the PMOS transistor 412 is coupled to ground via an impedance 444, and the drain of the PMOS transistor 416 is coupled to ground via an impedance 448.

The impedances 436, 440, 444, and 448 are configured to provide suitable impedance at the signaling frequency. In some embodiments, the impedances 436, 440, 444, and 448 are tuned to provide suitable impedance at the signaling frequency. In various embodiments, the impedances 436, 440, 444, and 448 comprise resistors, current mirrors, suitable tuned impedances, etc. In some embodiments, the values of the impedances 436, 440, 444, and 448 are chosen based on other application requirements for the buffer amplifier 400. Typically, the values of the impedances 436, 440, 444, and 448 are chosen based on a tradeoff between creating a choke at a frequency of interest and providing headroom for the buffer amplifier 400.

In some embodiments, the impedances 436, 440, 444, and 448 are omitted.

The feedback circuitry also comprises a PMOS transistor 452 having a source coupled to the drain of the NMOS transistor 404, and a drain coupled to Von; and a PMOS transistor 456 having a source coupled to the drain of the NMOS transistor 408, and a drain coupled to Vop. A gate of the PMOS transistor 452 and a gate of the PMOS transistor 456 are coupled to a bias voltage Vbp.

The feedback circuitry also comprises an NMOS transistor 460 having a source coupled to the drain of the PMOS transistor 412, and a drain coupled to Von; and an NMOS transistor 464 having a source coupled to the drain of the PMOS transistor 416, and a drain coupled to Vop. A gate of the NMOS transistor 460 and a gate of the NMOS transistor 464 are coupled to a bias voltage Vbn.

The transistors 452, 456, 460, 464 operate as feedback circuitry that improves high frequency performance, in some embodiments. For example, when the input node Vip decreases in voltage, the source of the PMOS transistor 452 tends to increase in voltage, which tends to cause the drain of the PMOS transistor 452 to pull the node Von upwards in voltage. Similarly, when the input node Vin decreases in voltage, the source of the PMOS transistor 456 tends to increase in voltage, which tends to cause the drain of the PMOS transistor 456 to pull the node Vop upwards in voltage.

Similarly, when the input node Vip increases in voltage, the source of the NMOS transistor 460 tends to decrease in voltage, which tends to cause the drain of the NMOS transistor 460 to pull the node Von downwards in voltage. Similarly, when the input node Vin increases in voltage, the source of the NMOS transistor 464 tends to decrease in voltage, which tends to cause the drain of the NMOS transistor 464 to pull the node Vop downwards in voltage.

In some embodiments, the transistors 452, 456, 460, and 464 are omitted.

A capacitor 468 is coupled to the gate of the NMOS transistor 404 and is coupled to the power supply via the impedance 440. A capacitor 472 is coupled to the gate of the NMOS transistor 408 and is coupled to the power supply via the impedance 436. A capacitor 476 is coupled to the gate of the PMOS transistor 412 and is coupled to ground via the impedance 444. A capacitor 480 is coupled to the gate of the PMOS transistor 416 and is coupled to ground via the impedance 448.

The capacitors 468, 472, 476, 480 operate as feedback circuitry that improves high frequency performance, in some embodiments. For example, when the input node Vip increases in voltage, the capacitor 468 tends to pull the drain of the NMOS transistor 408 upwards in voltage, which tends to cause the node Von to decrease in voltage. Similarly, when the input node Vin increases in voltage, the capacitor 472 tends to pull the drain of the NMOS transistor 404 upwards in voltage, which tends to cause the node Vop to decrease in voltage. Similarly, when the input node Vip decreases in voltage, the capacitor 476 tends to pull the drain of the PMOS transistor 416 downwards in voltage, which tends to cause the node Von to increase in voltage. Similarly, when the input node Vin decreases in voltage, the capacitor 480 tends to pull the drain of the PMOS transistor 412 downwards in voltage, which tends to cause the node Vop to increase in voltage.

In some embodiments, the capacitors 468, 472, 476, 480 are omitted.

Similar suitable buffer amplifiers using other transistor technologies (e.g., BiCMOS, IGBT, etc.) are used in other embodiments. Those of ordinary skill in the art will recognize other variations, modifications, and alternatives to the buffer amplifier configuration of FIG. 4.

Figure 5:
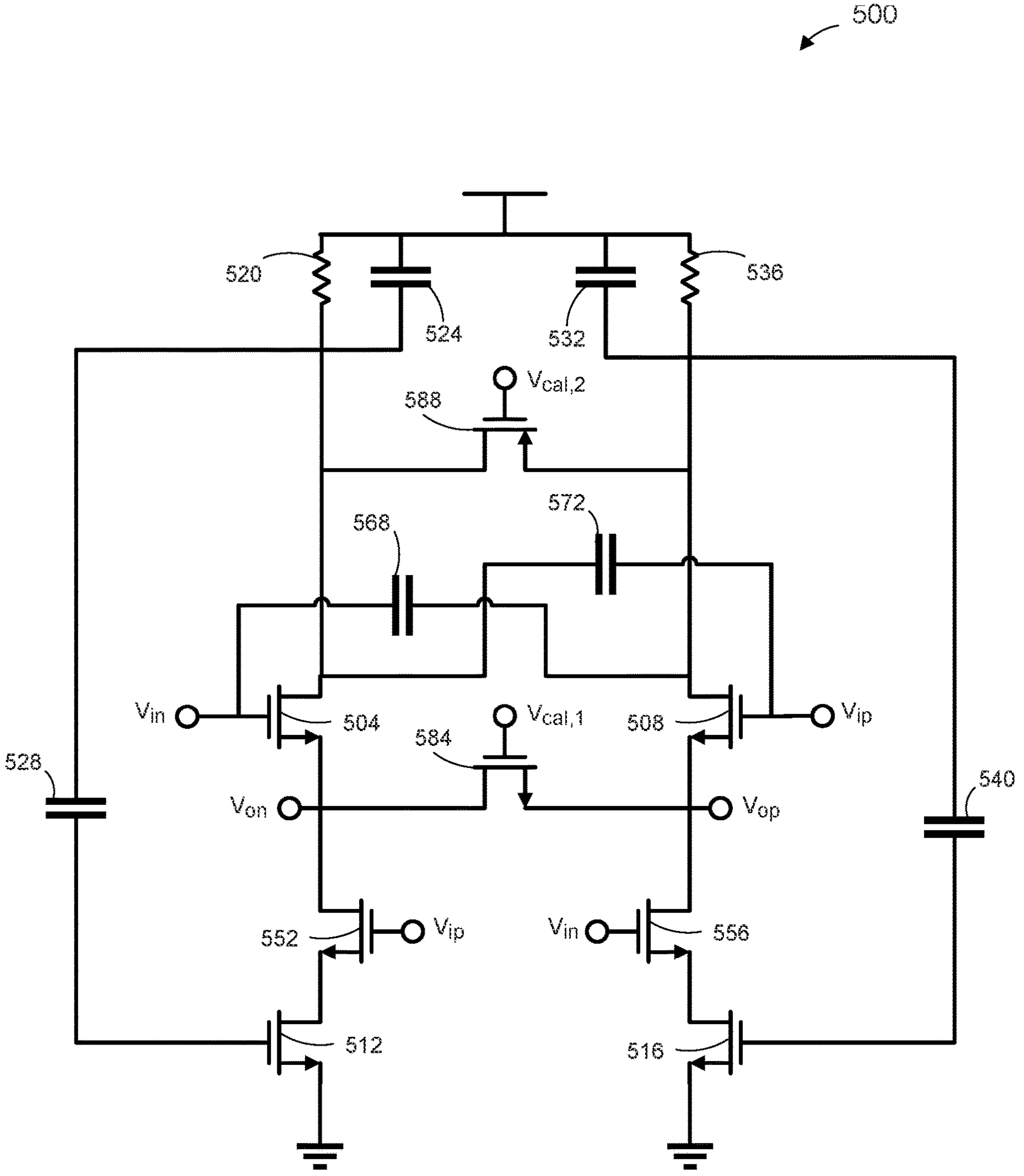
FIG. 5 is a simplified circuit diagram of another example buffer amplifier of the AFE of FIG. 2, according to an embodiment.

FIG. 5 is a simplified circuit diagram of an example buffer amplifier 500, according to an embodiment. The buffer amplifier 500 is used as the second buffer amplifier 140 of FIGS. 1 and 2, in some embodiments. In other embodiments, the buffer amplifier 140 includes another buffer amplifier different than the buffer amplifier 500.

The buffer amplifier 500 includes a cross-coupled super source follower circuit comprising NMOS transistors 504, 508, 512, and 516. A source of the NMOS transistor 504 is coupled to a drain of the NMOS transistor 512. A source of the NMOS transistor 508 is coupled to a drain of the NMOS transistor 516. A drain of the NMOS transistor 508 is coupled to a voltage supply, and a drain of the NMOS transistor 504 is coupled to the voltage supply. A source of the NMOS transistor 512 is coupled to ground, and a source of the NMOS transistor 516 is coupled to ground. A gate of the NMOS transistor 512 is coupled to the drain of the NMOS transistor 504, and a gate of the NMOS transistor 516 is coupled to the drain of the NMOS transistor 508.

A gate of the NMOS transistor 504 is coupled to an input node Vin, and a gate of the NMOS transistor 508 is coupled to an input node Vip. An output node Vop is coupled to the source of the NMOS transistor 508, and an output node Von is coupled to the source of the NMOS transistor 504. The input nodes Vip and Vin correspond to a differential input, and the output nodes Vop and Von correspond to a differential output.

The input nodes Vip and Vin are coupled to a differential output of impedance matching circuitry, such as the differential output of the impedance shifting network 132 of FIGS. 1 and 2, the differential output Vop and Von of the impedance shifting network 300 of FIG. 3, or a differential output of other suitable impedance matching circuitry, in various embodiments. The output nodes Vop and Von are coupled to differential input(s) of one or more sets of sampler array circuitry 204, or other suitable circuitry, in various embodiments.

The buffer amplifier 500 includes first feedback circuitry that is coupled to the drain of the NMOS transistor 504, and second feedback circuitry that is coupled to the drain of the NMOS transistor 508. The first feedback circuitry and the second feedback circuitry are configured to provide faster settling and thus improve performance at signaling frequency. For example, the first feedback circuitry comprises a resistor 520 in parallel with a capacitor 524 via which the drain of the NMOS transistor 504 is coupled to the voltage supply. Additionally, the first feedback circuitry comprises a capacitor 528 via which the drain of the NMOS transistor 504 is coupled to the gate of the NMOS transistor 512. Similarly, the second feedback circuitry comprises a resistor 532 in parallel with a capacitor 536 via which the drain of the NMOS transistor 508 is coupled to the voltage supply. Additionally, the second feedback circuitry comprises a capacitor 540 via which the drain of the NMOS transistor 508 is coupled to the gate of the NMOS transistor 516. Values of the resistors 520, 536 and the capacitors 524, 528, 536, 540 are chosen based on a tradeoff between i) achieving a corner frequency of interest and ii) providing headroom for the buffer amplifier 500 and/or maintaining stability.

In some embodiments, the first feedback circuitry and/or the second feedback circuitry are omitted. In some embodiments, one or more of the resistors 520, 536, and the capacitors 524, 528, 536, 540 are omitted.

The buffer amplifier 500 includes degenerated common source circuitry coupled to the source of the NMOS transistor 504 and the source of the NMOS transistor 508, the degenerated common source circuitry being configured to improve a gain of the buffer amplifier 500. The degenerated common source circuitry is also coupled to the drain of the NMOS transistor 512 and the drain of the NMOS transistor 516. For example, the buffer amplifier includes an NMOS transistor 552 and an NMOS transistor 556. A drain of the NMOS transistor 552 is coupled to the source of the NMOS transistor 504, and a source of the NMOS transistor 552 is coupled to the drain of the NMOS transistor 512. A gate of the NMOS transistor 552 is coupled to the input node Vip. A drain of the NMOS transistor 556 is coupled to the source of the NMOS transistor 508, and a source of the NMOS transistor 556 is coupled to the drain of the NMOS transistor 516. A gate of the NMOS transistor 556 is coupled to the input node Vin.

In some embodiments, the transistors 552 and 556 are omitted.

The buffer amplifier 500 includes third feedback circuitry that is coupled between the gate of the NMOS transistor 504 and the drain of the NMOS transistor 508, and fourth feedback circuitry that is coupled between the gate of the NMOS transistor 508 and the drain of the NMOS transistor 504. For example, the third feedback circuitry comprises a capacitor 568 that is coupled to the gate of the NMOS transistor 504 and is coupled to the drain of the NMOS transistor 508; and the fourth feedback circuitry comprises a capacitor 572 that is coupled to the gate of the NMOS transistor 508 and is coupled to the drain of the NMOS transistor 504.

The capacitors 568, 572 operate as feedback circuitry that improves high frequency performance, in some embodiments. For example, when the input node Vip increases in voltage, the capacitor 572 tends to pull the drain of the NMOS transistor 504 upwards in voltage, which tends to cause the node Von to decrease in voltage. Similarly, when the input node Vin increases in voltage, the capacitor 568 tends to pull the drain of the NMOS transistor 508 upwards in voltage, which tends to cause the node Vop to decrease in voltage. Values of the capacitors 568, 572 are chosen generally to match the gate-drain capacitances of the transistors 504 and 572 to a suitable degree.

In some embodiments, the third feedback circuitry and/or the fourth feedback circuitry are omitted. In some embodiments, the capacitors 568, 572 are omitted.

An NMOS transistor 584 is coupled between the source of the NMOS transistor 504 and the source of the NMOS transistor 508. In particular, a drain of the NMOS transistor 584 is coupled to the source of the NMOS transistor 504, and a source of the NMOS transistor 584 is coupled to the source of the NMOS transistor 508. A gate of the NMOS transistor 584 is coupled to a first calibration voltage Vcal,1.

A PMOS transistor 588 is coupled between the drain of the NMOS transistor 504 and the drain of the NMOS transistor 508. In particular, a drain of the PMOS transistor 588 is coupled to the drain of the NMOS transistor 504, and a source of the PMOS transistor 588 is coupled to the drain of the NMOS transistor 508. A gate of the PMOS transistor 588 is coupled to a second calibration voltage Vcal,2.

The gain of the buffer amplifier 500 is adjustable by varying the Vcal,1 and Vcal,2, in an embodiment.

Similar suitable buffer amplifiers using other transistor technologies (e.g., BiCMOS, IGBT, etc.) are used in other embodiments. Those of ordinary skill in the art will recognize other variations, modifications, and alternatives to the buffer amplifier configuration of FIG. 4.

While the present disclosure has been described with reference to specific examples, which are intended to be illustrative only and not to be limiting of the invention, changes, additions and/or deletions may be made to the disclosed embodiments without departing from the scope of the invention.

What is claimed is:

1. Analog front end (AFE) circuitry for a communication receiver, the AFE circuitry comprising:

an input matching network configured to receive a differential input signal;

one or more first buffer amplifiers coupled to the input matching network;

a sampler array coupled to the one or more first buffer amplifiers, the sampler array comprising a plurality of instances of track and hold circuitry, each instance of the track and hold circuitry configured to generate an analog output signal; and a plurality of second buffer amplifiers coupled to the sampler array, each second buffer amplifier comprising respective super source follower (SSF) circuitry and being configured to amplify a respective analog output signal of the sampler array, and each SSF circuitry of each second buffer amplifier comprising:

a first transistor having a first gate coupled to a first differential input node of the second buffer amplifier;

a second transistor having a second gate coupled to a second differential input node of the second buffer amplifier;

first feedback circuitry that is coupled to a first drain of the first transistor, the first feedback circuitry comprising a first resistor in parallel with a first capacitor, the first resistor and the first capacitor coupling the first drain of the first transistor to a voltage supply;

second feedback circuitry that is coupled to a second drain of the second transistor, the second feedback circuitry comprising a second resistor in parallel with a second capacitor, the second resistor and the second capacitor coupling the second drain of the second transistor to the voltage supply;

a third transistor coupled in series with the first transistor, the third transistor having i) a third drain coupled to a first source of the first transistor, and ii) a third gate coupled to the second differential input node of the second buffer amplifier; and a fourth transistor coupled in series with the first transistor and the third transistor, the third transistor being coupled between the first transistor and the fourth transistor, the fourth transistor having a fourth source coupled to ground and a fourth drain coupled to a third source of the third transistor.

2. The AFE circuitry of claim 1, wherein:

each SSF circuitry of each second buffer amplifier further comprises a fifth transistor having a fifth drain coupled to a second source of the second transistor;

the first feedback circuitry of each SSF circuitry further comprises a third capacitor coupled between the first drain of the first transistor and a fourth gate of the fifth transistor; and the second feedback circuitry of each SSF circuitry further comprises a fourth capacitor coupled between the second drain of the second transistor and a fifth gate of the fifth transistor.

3. The AFE circuitry of claim 1, wherein:

the first feedback circuitry of each SSF circuitry comprises a first third capacitor coupled between the first drain of the first transistor and the second gate of the second transistor; and the second feedback circuitry of each SSF circuitry comprises a second-fourth capacitor coupled between the second drain of the second transistor and the first gate of the first transistor.

4. The AFE circuitry of claim 1, wherein the third transistor and the fourth transistor of each SSF circuitry of each second buffer amplifier corresponds to:

common source circuitry of each SSF circuitry of each second buffer amplifier, the common source circuitry coupled to the first source of the first transistor and the second differential input node.

5. The AFE circuitry of claim 1, wherein common source circuitry of each SSF circuitry comprises:

a fifth transistor having i) a fifth drain coupled to the second source of the second transistor, and ii) a fifth gate coupled to the first differential input node of the second buffer amplifier; and a sixth transistor having a sixth source coupled to ground and a sixth drain coupled to a fifth source of the fifth transistor.

6. The AFE circuitry of claim 1, wherein each SSF circuitry of each second buffer amplifier comprises:

a fifth transistor having i) a fifth drain coupled to the first source of the first transistor, ii) a fifth source coupled to a second source of the second transistor, and iii) a fifth gate coupled to a first calibration voltage, the fifth transistor being configured to adjust a gain of the SSF circuitry based on the first calibration voltage.

7. The AFE circuitry of claim 6, wherein each SSF circuitry of each second buffer amplifier further comprises:

a sixth transistor having i) a sixth drain coupled to the first drain of the first transistor, ii) a sixth source coupled to the second drain of the second transistor, and iii) a sixth gate coupled to a second calibration voltage, the sixth transistor being configured to further adjust the gain of the SSF circuitry based on the second calibration voltage.

8. The AFE circuitry of claim 1, wherein the AFE comprises a plurality of first buffer amplifiers, and wherein each first buffer amplifier comprises a class AB buffer amplifier that includes:

a first NMOS transistor having a source and a drain;

a first PMOS transistor having a source coupled to the source of the first NMOS transistor;

a second NMOS transistor having a source and a drain;

a second PMOS transistor having a source coupled to the source of the second NMOS transistor;

third feedback circuitry coupled between the source of the first NMOS transistor and the drain of the second NMOS transistor, and coupled between the source of the second NMOS transistor and the drain of the first NMOS transistor; and fourth feedback circuitry coupled between the source of the first PMOS transistor and a drain of the second PMOS transistor, and coupled between the source of the second PMOS transistor and a drain of the first PMOS transistor.

9. The AFE circuitry of claim 8, wherein:

each third feedback circuitry of each first buffer amplifier comprises i) a first impedance coupled between a voltage supply and the drain of the first NMOS transistor, and ii) a second impedance coupled between the voltage supply and the drain of the second NMOS transistor; and each fourth feedback circuitry of each first buffer amplifier comprises i) a third impedance coupled between ground and the drain of the first PMOS transistor, and ii) a fourth impedance coupled between ground and the drain of the second PMOS transistor.

10. The AFE circuitry of claim 1, wherein the input matching network comprises:

a first T-coil circuit;

a second T-coil circuit;

a first impedance coupled between the first T-coil circuit and a first input node of the input matching network; and a second impedance coupled between the second T-coil circuit and a second input node of the input matching network;

wherein the first impedance and the second impedance are configured to shift a portion of input loss of the impedance matching network to a frequency above a signaling frequency corresponding to the AFE.

11. The AFE circuitry of claim 10, wherein the input matching network further comprises:

a first resistor coupled to the first T-coil circuit;

a second resistor coupled between the first resistor and ground;

a third resistor coupled to the second T-coil circuit;

a fourth resistor coupled between the third resistor and ground; and a shunt capacitor coupled between the first resistor and the third resistor.

12. Analog front end (AFE) circuitry for a communication receiver, the AFE circuitry comprising:

an input matching network configured to receive a differential input signal;

a plurality of first buffer amplifiers coupled to the input matching network, each first buffer amplifier comprising a class AB source follower buffer amplifier that includes:

a first NMOS transistor having a source and a drain, a first PMOS transistor having a source coupled to the source of the first NMOS transistor, a second NMOS transistor having a source and a drain, a second PMOS transistor having a source coupled to the source of the second NMOS transistor, a first differential output node between the first NMOS transistor and the first PMOS transistor, the first differential output node connected to the source of the first NMOS transistor, a second differential output node between the second NMOS transistor and the second PMOS transistor, the second differential output node connected to the source of the second NMOS transistor, first feedback circuitry coupled between the source of the first NMOS transistor and the drain of the second NMOS transistor, and coupled between the source of the second NMOS transistor and the drain of the first NMOS transistor, and second feedback circuitry coupled between the source of the first PMOS transistor and a drain of the second PMOS transistor, and coupled between the source of the second PMOS transistor and a drain of the first PMOS transistor;

a sampler array coupled to the plurality of first buffer amplifiers, the sampler array comprising a plurality of instances of track and hold circuitry, each instance of the track and hold circuitry configured to generate an analog output signal; and a plurality of second buffer amplifiers coupled to the sampler array, each second buffer amplifier being configured to amplify a respective analog output signal of the sampler array.

13. The AFE circuitry of claim 12, wherein:

each first feedback circuitry of each first buffer amplifier comprises i) a first impedance coupled between a voltage supply and the drain of the first NMOS transistor, and ii) a second impedance coupled between the voltage supply and the drain of the second NMOS transistor; and each second feedback circuitry of each first buffer amplifier comprises i) a third impedance coupled between ground and the drain of the first PMOS transistor, and ii) a fourth impedance coupled between ground and the drain of the second PMOS transistor.

14. The AFE circuitry of claim 12, wherein the input matching network comprises:

a first T-coil circuit;

a second T-coil circuit;

a first impedance coupled between the first T-coil circuit and a first input node of the input matching network; and a second impedance coupled between the second T-coil circuit and a second input node of the input matching network;

wherein the first impedance and the second impedance are configured to shift a portion of input loss of the impedance matching network to a frequency above a signaling frequency corresponding to the AFE.

15. The AFE circuitry of claim 14, wherein the input matching network further comprises:

a first resistor coupled to the first T-coil circuit;

a second resistor coupled between the first resistor and ground;

a third resistor coupled to the second T-coil circuit;

a fourth resistor coupled between the third resistor and ground; and a shunt capacitor coupled between the first resistor and the third resistor.

16. Analog front end (AFE) circuitry for a communication receiver, the AFE circuitry comprising:

an input matching network configured to receive a differential input signal, including:

a first T-coil circuit, a second T-coil circuit, a first impedance coupled between the first T-coil circuit and a first input node of the input matching network, the first impedance comprising a first inductor coupled in series between the first T-coil circuit and the first input node of the input matching network, and a second impedance coupled between the second T-coil circuit and a second input node of the input matching network, the second impedance comprising a second inductor coupled in series between the second T-coil circuit and the second input node of the input matching network, the first impedance and the second impedance being configured to shift a portion of input loss of the impedance matching network to a frequency above a signaling frequency corresponding to the AFE;

one or more first buffer amplifiers coupled to the input matching network;

a sampler array coupled to the one or more first buffer amplifiers, the sampler array comprising a plurality of instances of track and hold circuitry, each instance of the track and hold circuitry configured to generate an analog output signal; and a plurality of second buffer amplifiers coupled to the sampler array, each second buffer amplifier comprising respective super source follower (SSF) circuitry and being configured to amplify a respective analog output signal of the sampler array.

17. The AFE circuitry of claim 16, wherein the input matching network further comprises:

a first resistor coupled to the first T-coil circuit;

a second resistor coupled between the first resistor and ground;

a third resistor coupled to the second T-coil circuit;

a fourth resistor coupled between the third resistor and ground; and a shunt capacitor coupled between the first resistor and the third resistor.

18. The AFE circuitry of claim 16, wherein:

the first impedance further comprises a first resistor coupled in parallel with the first inductor; and the second impedance further comprises a second resistor coupled in parallel with the second inductor.

* * * * *